United States Patent [19]

Sase et al.

[11] Patent Number: 4,496,967
[45] Date of Patent: Jan. 29, 1985

[54] SAMPLE HOLD CIRCUIT FOR AN IMAGE PICK-UP DEVICE

[75] Inventors: Masatoshi Sase, Atsugi; Makoto Onga, Fujisawa; Seisuke Yamanaka, Mitaka, all of Japan

[73] Assignee: Sony Corporation, Tokyo, Japan

[21] Appl. No.: 402,357

[22] Filed: Jul. 27, 1982

[30] Foreign Application Priority Data

Jul. 28, 1981 [JP] Japan .................................. 56-117130

[51] Int. Cl.³ .............................................. H04N 9/04
[52] U.S. Cl. ......................................... 358/44; 358/37
[58] Field of Search ....................... 358/44, 43, 36, 37, 358/167, 213; 307/353

Primary Examiner—Michael A. Masinick

Attorney, Agent, or Firm—Hill, Van Santen, Steadman & Simpson

[57] ABSTRACT

A dot sequential color signal which is generated in an image pick-up means, as for example a CCD type image sensor is supplied to a first sampling and hold (S/H) circuit, with the frequency of the sampling pulse used in the first S/H circuit being at a predetermined frequency (FO), and the output of the first S/H circuit is supplied to a second S/H circuit, with the frequency of the sampling pulse used in the second S/H circuit being selected to be N times of the predetermined frequency (NFo), so that the frequency of the sampling noise caused by the sampling operation is relatively high compared with the output signal of the image pick-up means, and thus the cut-off frequency of a low pass filter for eliminating the sampling noise can be selected to be high enough not to attenuate the desired signal.

4 Claims, 11 Drawing Figures

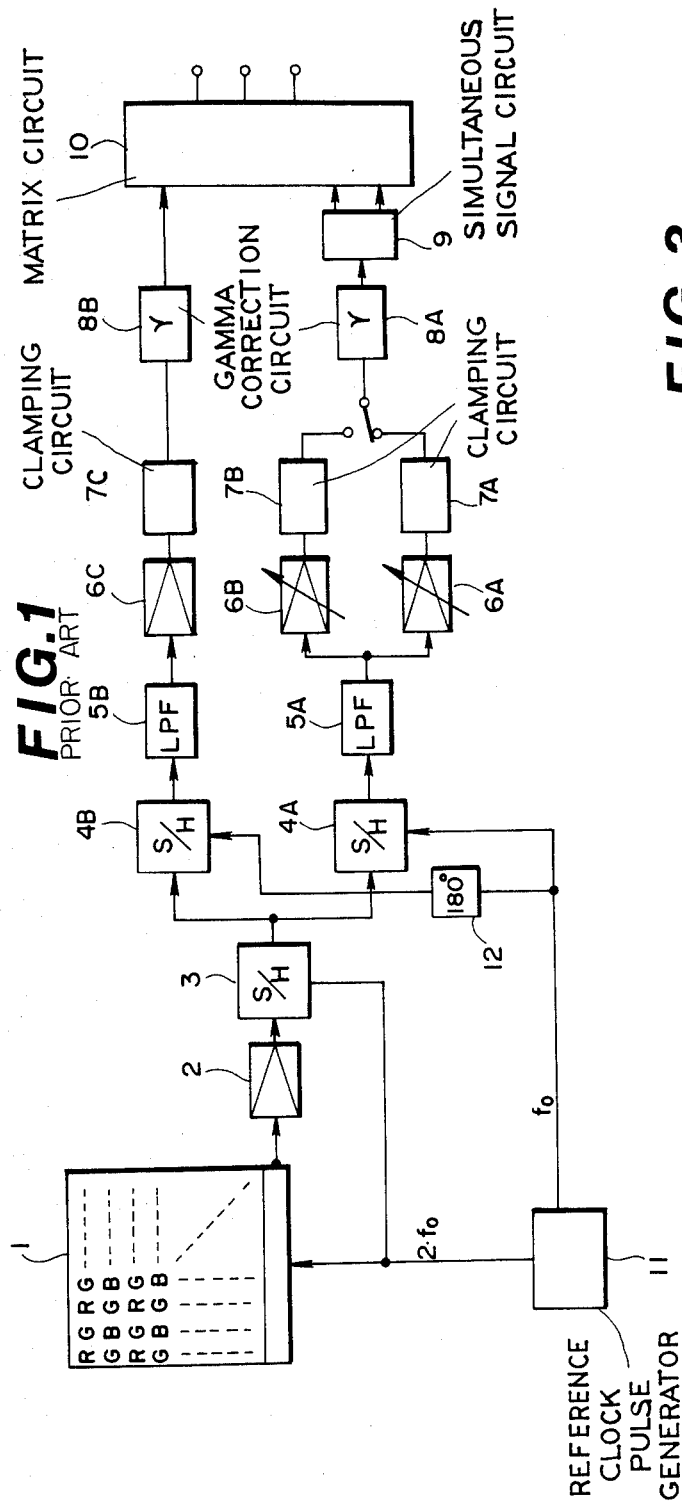

SAMPLE HOLD CIRCUIT FOR AN IMAGE PICK-UP DEVICE

BACKGROUND OF THE INVENTION

1. Field of the Invention

This invention relates to a sample/hold circuit for a color separation circuit in a solid-state color image pick-up device or the like using solid image sensors such as CCDs (charge coupled device).

2. Description of the Prior Art

In the usual charge transfer device color imager, the point sequential image signal that has been obtained through color coding in color filters, is passed through sample/hold circuits to separate the individual R, G and B color signal components prior to various signal treatments.

In a charge transfer device color imager, in which point sequential color decoding is done with color filters, the individual color signal components in the point sequential image signal are subjected to white balance adjustment, gamma correction and various other signal treatments. A signal processing circuit as shown in FIG. 1 has been extensively used for these signal treatments.

In the signal processing circuit of FIG. 1, which is used in a single chip CCD charge transfer device color imager, the image pick-up section includes a CCD1 as an image sensor, which is point sequential color coded by color filters. The CCD1 is driven by a drive clock signal which is provided from a reference clock pulse generator 11. The CCD1 is color coded by color filters such that odd horizontal scanning lines consist of alternate red and green picture elements and that even horizontal scanning lines consist of alternate green and blue picture elements.

The point sequential image signal that is continuously provided from the CCD1 contains three primary color signal components at a repetition frequency $f_0$ which is determined by the number of picture elements in the CCD1 ($f_0 = 3.58$ MHz in this example). It is read out from the CCD1 under the control of a driving clock signal at a clock frequency of $2 \cdot f_0$, and is supplied through a buffer amplifier 2 to a first sample/hold circuit 3. The first sample/hold circuit 3 effects the sampling and holding of the three primary color signal components in the point sequential image signal under the control of a sampling clock signal at a sampling frequency of $2 \cdot f_0$, provided from the reference clock pulse generator 11. A shaped point sequential image signal which has been obtained in the above manner, is supplied to second and third sample/hold circuits 4A and 4B. The second and third sample/hold circuits 4A and 4B separate the three primary color signal components in the shaped point sequential image signal. More particularly, the second sample/hold circuit 4A samples and holds the red and blue signal components in the shaped point sequential image signal under the control of a clock signal at a sampling frequency of $f_0$ which is supplied from the reference clock pulse generator 11. On the other hand, the third sample/hold circuit 4B samples and holds the green signal component in the shaped sequential image signal under the control of a clock signal at $f_0$ which is supplied through a phase shifter which shifts the phase by 180°.

The green signal obtained from the third sample/hold circuit 4B is coupled to a lowpass filter 5B, in which a sampling clock signal leakage component contained in the signal is removed. The output signal from the lowpass filter 5B is amplified by a constant gain amplifier 6C and then clamped to a predetermined signal level by a clamping circuit 7C before it is subjected to a gamma correction treatment in a gamma correction circuit 8.

The output signal from the second sample/hold circuit 4A which contains the red and blue signals, is coupled to a lowpass filter 5A, in which a sampling clock signal leakage component contained in the signal is removed. The output signal from the lowpass filter 5A is coupled to variable gain amplifiers 6A and 6B for white balance adjustment. The outputs of the amplifiers 6A and 6B are clamped to a predetermined signal level by clamping circuits 7A and 7B. The outputs of the clamping circuits 7A and 7B are fed to a gamma correction circuit 8A for gamma correction. The output of the gamma correction circuit 8A is coupled to a simultaneous signal circuit 9 for conversion into simultaneous signals.

The three primary color signals which have been obtained through the white balance adjustment, clamping treatment and gamma correction treatment in the above manner, are supplied to a matrix circuit 10. The matrix circuit 10 forms the luminance signal and chrominance signals from the input three primary color signals.

The three primary color signals for forming a color television signal usually require a frequency band of approximately 3.5 MHz each. The second and third sample/hold circuits 4A and 4B in the signal processing circuit as described above, are required to effect sampling and holding the point sequential image signal at a sampling clock frequency $f_0$ which is close to the individual color signal frequencies. The lowpass filters 5A and 5B, which serve to remove the sampling clock signal leakage component contained in the individual color signals separated through the second and third sample/hold circuits 4A and 4B, can pass signals in a frequency range in which the color signal component frequencies exist. Also, they have to have a filter characteristic capable of sufficiently attenuating signals in a frequency range in which the leakage component exist. However, since the color signal component frequencies and the leakage component frequency are close to each other, it is impossible to provide an ideal filter which can attenuate only the leakage component.

In the signal processing circuit of the above construction, adverse effects of the sampling signal leakage component will appear in the subsequent signal processing system, for instance on the clamping operation in the clamping circuits 7A, 7B and 7C. Therefore, it is necessary to provide means which can cope with the aforementioned leakage component.

Usually, a sample/hold pulse leakage component is superimposed upon the output signal from a sample/hold circuit, as in the waveform shown in FIG. 2. This leakage component must be removed through a lowpass filter.

The lowpass filter must be capable of sufficiently attenuating frequencies in the range which covers the leakage component. Where the necessary signal component and leakage component frequencies are close to each other, and ideal filter which is capable of attenuating only the leakage component cannot be obtained so that it is impossible to reliably remove the leakage component.

SUMMARY OF THE INVENTION

This invention relates to apparatus for processing a color signal and more particularly, for sampling and holding a dot sequential color signal obtained from an image pick-up means. In the prior art of this invention, the dot sequential color signal is separated to obtain each color signal by sampling and holding with only one sampling and holding circuit in which the frequency of the sampling pulses is near a frequency band of each color signal, so that a low pass filter connected to the sampling and holding circuits cannot eliminate a sampling noise in each color signal.

It is an object of the invention to provide an improved signal processing circuit for eliminating the sampling noise to negligible level.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

BRIEF DESCRIPTION OF THE DRAWINGS

FIG. 1 is a block diagram of a prior art circuit;

FIG. 2 is a wave form of the output signal of the sampling and hold circuit (4B) shown in FIG. 1;

FIG. 3 is a block diagram of a double sampling and hold circuit of the present invention;

DESCRIPTION OF THE PREFERRED EMBODIMENTS

The present invention comprises an improved circuit of the above described type in which a novel sample/hold circuit, is provided in which when sampling and holding an input signal at a sampling clock frequency close to the input signal frequency, the frequency of the sampling clock signal leakage component contained in the sample/hold output signal is increased and is thus sufficiently separated from the input signal frequency so that the leakage component can be reliably removed in a succeeding stage lowpass filter.

An embodiment of the present invention will be described with reference to the drawings.

Figure 4A:
FIG. 4A is a wave form of a color signal obtained from the image pick-up means.
Figure 4B:
FIG. 4B is a wave form of the first sampling pulses.
Figure 4C:
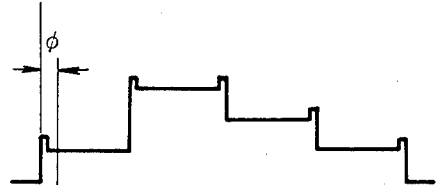
FIG. 4C is a wave form of the output signal of the first sampling and hold circuit.
Figure 4D:
FIG. 4D is a wave form of the second sampling pulses.
Figure 4E:
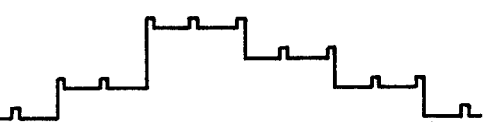
FIG. 4E is a wave form of the output signal of the second sampling and hold circuit.
Figure 5A:
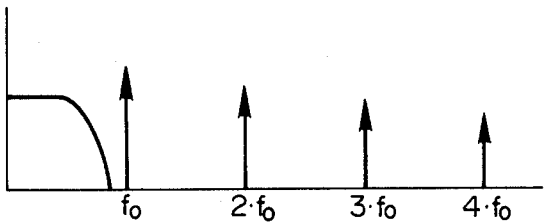
FIG. 5A shows a frequency spectrum of the prior art.

The basic construction and operation of the sample/hold circuit according to the present invention is shown in FIGS. 3 to 5.

As shown in FIG. 3, the sample/hold circuit 40 according to the present invention includes two sample/hold circuits 41 and 42 which are connected in cascade. The input side sample/hold circuit 41 samples and holds the input signal under the control of a sampling clock signal at a sampling frequency of $f_0$ which is close to the input signal frequency. The output side sample/hold circuit 42 samples and holds the output signal of the input side sample/hold circuit under the control of a sampling clock signal at a sampling frequency of $n \cdot f_0$ which is an integral multiple of (i.e., n times) the sampling frequency $f_0$.

For example, the input side sample/hold circuit 41 may sample and hold an input signal having a waveform as shown in FIG. 4A under the control of a first sampling clock signal as shown in FIG. 4B. In this case, a first sample/hold output signal which contains a leakage component resulting from the sampling clock signal is obtained, as shown in FIG. 4C. The first sample/hold output signal consists of input signal frequency components and sampling clock signal leakage components at the frequency and harmonic frequencies of the first sampling clock signal. The harmonic frequency components of the leakage components can be easily removed by a lowpass filter, but the leakage component at the sampling clock frequency which is close to the signal component frequencies usually cannot be removed. With the sample/hold circuit 40 according to the present invention, the output side sample/hold circuit 42 samples and holds the first sample/hold output signal under the control of a second sampling clock signal at a sampling frequency which is n times (n being 2 in the example) the first sampling clock signal frequency, as shown in FIG. 4D. Consequently, a second sample/hold output signal having a waveform as shown in FIG. 4E is obtained. This second output signal contains only sampling clock signal leakage component resulting from the second sampling clock signal.

Figure 5B:
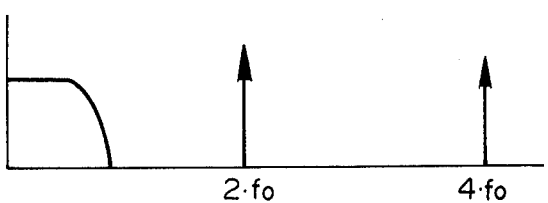
FIG. 5B shows a frequency spectrum of the present invention.

The leakage component at the fundamental frequency of the sampling clock signal is sufficiently spaced apart from the signal component frequencies, as shown in FIG. 5B, so that it can be easily removed by a succeeding stage lowpass filter, now shown.

A phase difference of $\phi$ is provided between the first and second sampling clock signals. This phase difference permits the second sample/hold circuit 42 to sample and hold the first sample/hold output signal over portions thereof other than the superimposed leakage component portions. That is, it is possible to prevent error components from being contained in the second sample/hold output signals.

The sample/hold circuit 40 described above according to the invention may be used as, for instance, the second and third sample/hold circuits 4A and 4B for color separation in the signal processing circuit for the CCD charge transfer device color imager described above according to the invention.

Figure 6:
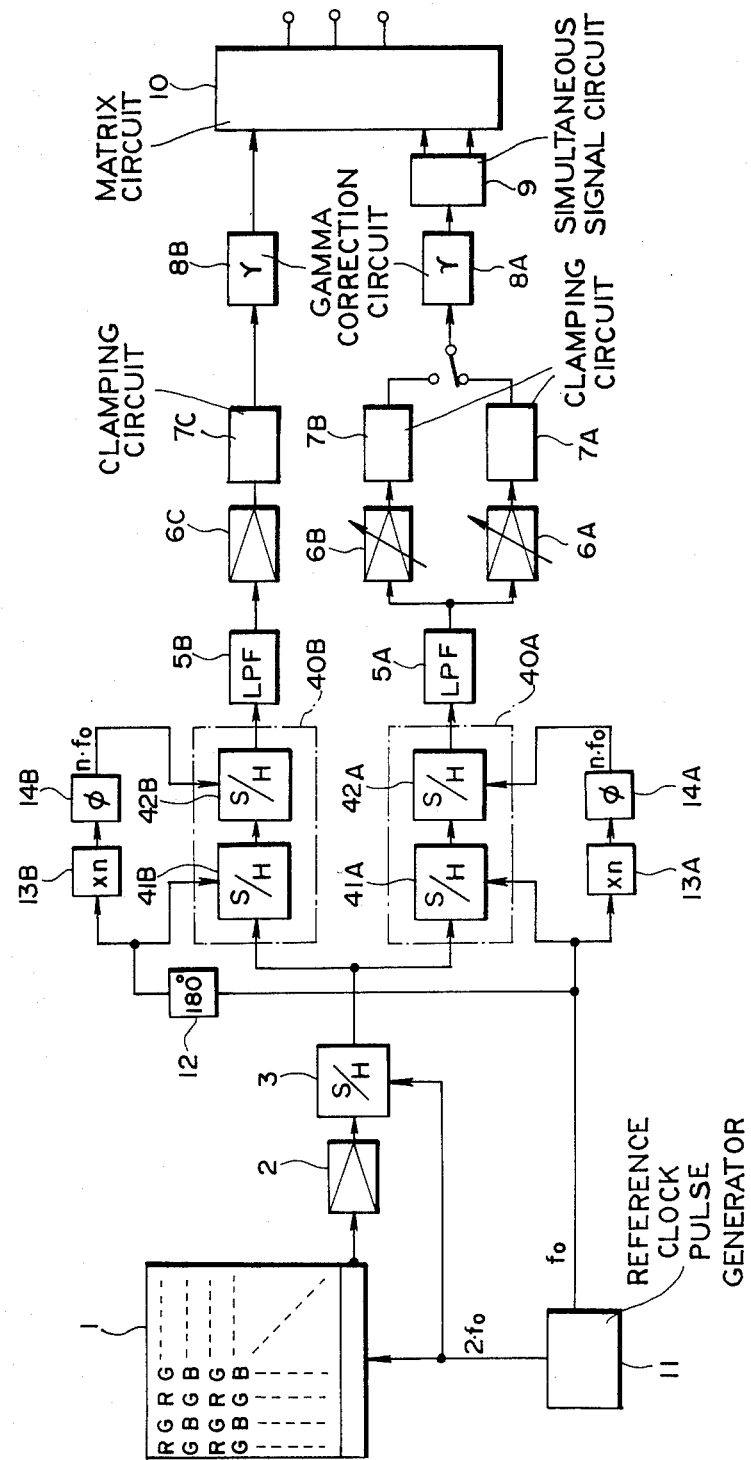
FIG. 6 is a block diagram of the signal processing circuit of the present invention.

FIG. 6 shows an embodiment of a signal processing circuit which employs the invention. In this embodiment, sample/hold circuits 40A and 40B for color separation are constructed as the sample/hold circuit according to the invention illustrated in FIG. 3.

In this circuit, the second and third sample/hold circuits 40A and 40B, to which the point sequential image signal is supplied from the first sample/hold circuit 3, include respective input side sample/hold circuits 41A and 41B and output side sample/hold circuits 42A and 42B.

A sampling clock signal at a sampling frequency of $f_0$ is supplied by reference clock pulse generator 11 directly to the input side of the sample/hold circuit 41A in the second sample/hold circuit 40A. A sampling clock signal at a sampling frequency of $n \cdot f_0$, i.e., which is n times the aforementioned sampling frequency $f_0$, and which is obtained from an n-factor frequency multiplier 13, is supplied to the output sample/hold circuit 42A through a phase shifter 14A, which provides a phase shift of $\phi$. The sampling clock signal at the sampling frequency $f_0$ obtained from the reference clock pulse generator 11, is also supplied through phase shifter 12, which provides a phase shift by $\phi$, to the input side of sample/hold circuit 41B in the third sample/hold circuit 40B. A sampling clock signal at a sampling frequency of $n \cdot f_0$, which is obtained from a frequency multiplier 13B which multiplies the aforementioned sampling clock signal frequency $f_0$ by n, is supplied to the output side of the sample/hold circuit 42B through a phase shifter 14B. The other elements other than the sample/hold circuits 40A and 40B and multipliers 13A and 13B and phase shifters 14A and 14B in the invention are the same as those in the signal processing circuit shown in FIG. 1, so they are designated by like reference symbols and their description is not repeated.

In the embodiment of the invention with the novel second and third sample/hold circuits 40A and 40B, the sampling clock signal leakage component contained in the output signals of the sample/hold circuits 40A and 40B, i.e., the separated three primary color signal components, has an increased fundamental frequency of $n \cdot f_0$ which is sufficiently spaced from the three primary color signal component frequencies to allow separation. Thus, the leakage components can be reliably removed in the succeeding stage lowpass filters 5A and 5B. Stable operation of the clamping circuits 7A and 7B and other circuits can be thus ensured to obtain reliable and proper signal treatment.

Although the invention has been described with respect to preferred embodiments, it is not to be so limited as changes and modifications can be made which are within the full intended scope of the invention as defined by the appended claims.

We claim as our invention:

1. A signal processing apparatus which is used for processing a color signal component in a dot sequential color signal coded by a color filter constructed in an image pick-up means comprising, a first sampling and hold circuit operated by a sampling pulses having a predetermined frequency $f_0$, a second sampling and hold circuit receiving the output of said first sampling and hold circuit and operated by a sampling pulse at a frequency which is selected to be N times the predetermined frequency ($Nf_0$) for sampling and holding an output signal of the first sampling and hold circuit, and a first low pass filter receiving the output of said second sampling and hold circuit and having a cut-off frequency for eliminating the sampling noise of said second sampling and hold circuit sufficiently so that said color signal is not attenuated, further comprising a third sampling and hold circuit receiving another color signal and operated by sampling pulses with a sampling frequency of $f_0$, a fourth sampling and hold circuit receiving the output of said third sampling and hold circuit and with a sampling frequency of $Nf_0$ and a second low pass filter receiving the output of said fourth sampling and hold circuit and having a cut-off frequency so that the color signal will not be attenuated, wherein N is an integer other than one, including a first phase shifter which shifts the phase of the sampling pulses used in said third and fourth sampling and hold circuits 180 degrees from the phases of the sampling pulses used in said first and second sampling and hold circuits, including a second phase shifter for shifting the sampling pulses supplied to said second sampling and hold circuit to eliminate sampling of noise components, and including a third phase shifter for shifting the sampling pulses supplied to said fourth sampling and hold circuit to eliminate sampling of noise component.

2. A color signal processing apparatus comprising a source of color signals, a clock pulse generator, a first sampling and hold circuit receiving the output of said source of color signals and an input from said clock pulse generator, second and third sampling and hold circuits receiving the output of said first sampling and hold circuit, a first phase shifter with a phase shift of 180 degrees connected between said clock pulse generator and said third sampling and hold circuit, said second sampling and hold circuit receiving an output from said clock pulse generator, a fourth sampling and hold circuit receiving the output of said second sampling and hold circuit, a first frequency multiplier connected between said clock pulse generator and said fourth sampling and hold circuit, a fifth sampling and hold circuit receiving the output of said third sampling and hold circuit, a second frequency multiplier connected between said first phase shifter and said fifth sampling and hold circuit, and first and second low pass filters connected, respectively, to the outputs of said fourth and fifth sampling and hold circuits.

3. A color signal processing apparatus according to claim 2 including a second phase shift circuit connected between said first frequency multiplier and said fourth sampling and hold circuit.

4. A color signal processing apparatus according to claim 3 including a third phase shift circuit connected between said second frequency multiplier and said fifth sampling and hold circuit.

* * * * *